US009153737B2

(12) United States Patent
Nam et al.

(10) Patent No.: US 9,153,737 B2
(45) Date of Patent: Oct. 6, 2015

(54) HIGH-QUALITY NON-POLAR/SEMI-POLAR SEMICONDUCTOR DEVICE ON POROUS NITRIDE SEMICONDUCTOR AND MANUFACTURING METHOD THEREOF

(75) Inventors: Ok Hyun Nam, Seoul (KR); Dong Hun Lee, Seoul (KR); Geun Ho Yoo, Incheon (KR)

(73) Assignees: Seoul Viosys Co., Ltd., Ansan-si (KR); Korea Polytechnic University Industry Academic Cooperation Foundation, Siheung-si (KR)

( * ) Notice: Subject to any disclaimer, the term of this patent is extended or adjusted under 35 U.S.C. 154(b) by 23 days.

(21) Appl. No.: 13/502,241

(22) PCT Filed: Aug. 27, 2010

(86) PCT No.: PCT/KR2010/005764
§ 371 (c)(1),
(2), (4) Date: Apr. 16, 2012

(87) PCT Pub. No.: WO2011/046292
PCT Pub. Date: Apr. 21, 2011

(65) Prior Publication Data
US 2012/0205665 A1    Aug. 16, 2012

(30) Foreign Application Priority Data
Oct. 16, 2009    (KR) .......................... 10-2009-0098521

(51) Int. Cl.
*H01L 21/00*    (2006.01)
*H01L 33/16*    (2010.01)
(Continued)

(52) U.S. Cl.
CPC ............ *H01L 33/16* (2013.01); *H01L 29/2003* (2013.01); *H01L 31/0304* (2013.01);
(Continued)

(58) Field of Classification Search
CPC ...... H01L 33/0062; H01L 33/20; H01L 33/16
USPC ............................... 257/E29.09; 438/47, 479
See application file for complete search history.

(56) References Cited

U.S. PATENT DOCUMENTS 4,176,003 A * 11/1979 Brower et al. ................ 430/313
5,961,683 A * 10/1999 Mizuta et al. ................... 65/386
(Continued)

FOREIGN PATENT DOCUMENTS

| CN | 101054723 | 10/2007 |
| JP | 2001-223165 | 8/2001 |

(Continued)

OTHER PUBLICATIONS

International Search Report of PCT/KR2010/005764 dated Apr. 26, 2011.
(Continued)

*Primary Examiner* — Caleb Henry
*Assistant Examiner* — Alexander Belousov
(74) *Attorney, Agent, or Firm* — H.C. Park & Associates, PLC (57) ABSTRACT

Provided are a high-quality non-polar/semi-polar semiconductor device having reduced defect density of a nitride semiconductor layer and improved internal quantum efficiency and light extraction efficiency, and a manufacturing method thereof. The method for manufacturing a semiconductor device is to form a template layer and a semiconductor device structure on a sapphire, SiC or Si substrate having a crystal plane for a growth of a non-polar or semi-polar nitride semiconductor layer. The manufacturing method includes: forming a nitride semiconductor layer on the substrate; performing a porous surface modification such that the nitride semiconductor layer has pores; forming the template layer by re-growing a nitride semiconductor layer on the surface-modified nitride semiconductor layer; and forming the semiconductor device structure on the template layer.

11 Claims, 5 Drawing Sheets

(51) Int. Cl.
*H01L 29/20* (2006.01)
*H01L 31/0304* (2006.01)
*H01L 31/18* (2006.01)
*H01L 33/12* (2010.01)
*H01L 33/20* (2010.01)
*H01L 33/00* (2010.01)
*H01L 33/22* (2010.01)
*H01S 5/02* (2006.01)
*H01S 5/32* (2006.01)
*H01S 5/323* (2006.01)

(52) U.S. Cl.
CPC .......... *H01L31/1856* (2013.01); *H01L 33/007* (2013.01); *H01L 33/12* (2013.01); *H01L 33/0062* (2013.01); *H01L 33/20* (2013.01); *H01L 33/22* (2013.01); *H01S 5/0213* (2013.01); *H01S 5/3202* (2013.01); *H01S 5/32341* (2013.01); *H01S 2304/12* (2013.01); *Y02E 10/544* (2013.01)

(56) References Cited

U.S. PATENT DOCUMENTS

| | | | |
|---|---|---|---|
| 8,237,194 B2 * | 8/2012 | Yoshida et al. | 257/183 |
| 2005/0077512 A1 | 4/2005 | Yoon et al. | |
| 2007/0221948 A1 * | 9/2007 | Choi et al. | 257/103 |
| 2009/0079035 A1 * | 3/2009 | Wang | 257/615 |
| 2009/0137126 A1 * | 5/2009 | Kim et al. | 438/703 |
| 2009/0166649 A1 * | 7/2009 | Lee | 257/94 |
| 2009/0212319 A1 * | 8/2009 | Muraki et al. | 257/103 |

FOREIGN PATENT DOCUMENTS

| | | | | |
|---|---|---|---|---|
| JP | 2002-050586 | 2/2002 | | |
| JP | 2005-085851 | 3/2005 | | |
| JP | 2007-250611 | 9/2007 | | |
| JP | WO2007145300 | * 12/2007 | ............. | H01L 33/00 |
| JP | WO2008114772 | * 9/2008 | ......... | C23C 16/0272 |
| KR | 10-2005-0035565 | 4/2005 | | |
| KR | 10-2007-0095181 | 9/2007 | | |

OTHER PUBLICATIONS

Chinese Office Action issued Nov. 3, 2014 in CN Application No. 101080046603.5.

Chinese Office Action issued Mar. 23, 2015, in Chinese Application No. 201080046603.5.

Xu Sheng-Rui et al., The triangular pits eliminate of (11 0) a-plane GaN growth by metal-organic chemical vapor deposition, Acta Physica Sinica, Aug. 2009, vol. 58, Issue 8, p. 5705.

* cited by examiner

HIGH-QUALITY NON-POLAR/SEMI-POLAR SEMICONDUCTOR DEVICE ON POROUS NITRIDE SEMICONDUCTOR AND MANUFACTURING METHOD THEREOF

CROSS-REFERENCES TO RELATED APPLICATION

This application is the National Stage Entry of International Application No. PCT/KR2010/005764, filed on Aug. 27, 2010, and claims priority from and the benefit of Korean Patent Application No. 10-2009-0098521, filed on Oct. 16, 2009, both of which are herein incorporated by reference for all purposes as if fully set forth herein.

BACKGROUND

1. Field

The present invention relates to a semiconductor optical device and a manufacturing method thereof, and more particularly, to a high-quality non-polar/semi-polar semiconductor device and a manufacturing method thereof. In the high-quality non-polar/semi-polar semiconductor device, a non-polar/semi-polar nitride semiconductor crystal is formed on a sapphire crystal plane, which enables the growth of a non-polar/semi-polar nitride semiconductor layer, in order that a piezoelectric effect generated in a polar nitride semiconductor layer may not occur in a nitride semiconductor layer. In addition, an $In_xAl_yGa_{1-x-y}N$ layer ($0 \le x \le 1$, $0 \le y \le 1$, $0 \le x+y \le 1$) is re-grown on a porous GaN layer formed on a template layer over a sapphire substrate to reduce the defect density of the GaN layer and improve the internal quantum efficiency and light extraction efficiency thereof.

2. Discussion of the Background

Since group III-V nitride semiconductors (also simply called "nitride semiconductors"), such as GaN, have excellent physical and chemical properties, they have recently been recognized as the essential material for semiconductor optical devices, such as a light emitting diode (LED), a laser diode (LD), and a solar cell. In general, group III-V nitride semiconductors are composed of a semiconductor material having an empirical formula of $In_xAl_yGa_{1-x-y}N$ ($0 \le x \le 1$, $0 \le y \le 1$, $0 \le x+y \le 1$). Such nitride semiconductor optical devices are applied as light sources for a variety of products, such as a keypad of a mobile phone, an electronic display board, and a lighting device.

In particular, as digital products using LEDs or LDs have evolved, there is an increasing demand for nitride semiconductor optical devices having higher brightness and higher reliability. For example, a side view LED used as a backlight of is a mobile phone is required to be brighter and thinner as the mobile phone tends to be slimmer. However, if a nitride semiconductor, such as polar GaN, is grown on a sapphire substrate using a C-plane (e.g., (0001) plane) as a sapphire crystal plane, the internal quantum efficiency may be reduced by a piezoelectric effect caused by the formation of a polarization field.

Accordingly, it is necessary to form a non-polar/semi-polar nitride semiconductor on a sapphire substrate. However, crystal defects, such as a line defect and an area defect, may be caused by a lattice mismatch between sapphire, which is suitable for the formation of a template layer using non-polar/semi-polar GaN or the like, and a non-polar/semi-polar nitride semiconductor template layer, which is formed on the sapphire, and a difference in coefficient of thermal expansion between constituent elements. Such crystal defects have a bad influence on the reliability of an optical device, for example, a resistance to electrostatic discharge (ESD), and are also the cause of current leakage within the optical device. As a result, the quantum efficiency of the optical device may be reduced, leading to the performance degradation of the optical device.

A variety of efforts have been made to reduce a crystal defect of a nitride semiconductor layer. One of these efforts is the use of a selective epitaxial growth. However, these efforts require high costs and complicated processes, such as $SiO_2$ mask deposition. In addition, a crystal defect may be reduced by forming a low-temperature buffer layer on a sapphire substrate and then forming GaN thereon. However, this is not enough to solve a crystal defect problem of an optical device. Therefore, it is necessary to solve a problem that degrades the brightness and reliability of an optical device due to a crystal defect.

SUMMARY

An aspect of the present invention is directed to a high-quality non-polar/semi-polar semiconductor device and a manufacturing method thereof. In the high-quality non-polar/semi-polar semiconductor device, a nitride semiconductor crystal is formed on a sapphire crystal plane, which enables the growth of a non-polar/semi-polar nitride semiconductor layer, in order to eliminate a piezoelectric effect generated in a polar GaN nitride semiconductor. In addition, an $In_xAl_yGa_{1-x-y}N$ layer ($0 \le x \le 1$, $0 \le y \le 1$, $0 \le x+y \le 1$) is re-grown on a porous GaN layer formed on a template layer over a sapphire substrate to improve a surface profile, to reduce the defects of the GaN layer, and to improve the crystal quality thereof. Accordingly, the internal quantum efficiency and light extraction efficiency of the semiconductor device may be improved.

According to an embodiment of the present invention, a method for manufacturing a semiconductor device, in which a template layer and a semiconductor device structure are formed on a substrate having a crystal plane for a growth of a non-polar or semi-polar nitride semiconductor layer, includes: forming a nitride semiconductor layer on the substrate; performing a porous surface modification such that the nitride semiconductor layer has pores; forming the template layer by re-growing a nitride semiconductor layer on the surface-modified nitride semiconductor layer; and forming the semiconductor device structure on the template layer.

In the semiconductor device manufactured by the above-described method, the nitride semiconductor layer before the porous surface modification or the re-grown nitride semiconductor layer may include an $In_xAl_yGa_{1-x-y}N$ ($0 \le x \le 1$, $0 \le y \le 1$, $0 \le x+y \le 1$), an undoped GaN layer, an n-type doped GaN layer, or a p-type doped GaN layer.

The substrate may include a sapphire substrate, a SiC substrate, or a Si substrate.

The crystal plane of the substrate may include an A-plane, an M-plane, or an R-plane.

The porous surface modification of the nitride semiconductor layer may be performed using a wet etching solution. The growth of the nitride semiconductor layer before the porous surface modification of the nitride semiconductor layer, and the re-growth of the nitride semiconductor layer after the porous surface modification of the nitride semiconductor layer may be performed through a metal organic chemical vapor deposition (MOCVD) process.

The wet etching solution may include a solution containing potassium hydroxide, sodium hydroxide, sulfuric acid, phosphoric acid, nitric acid, or hydrochloric acid in a concentration range of 0.001 M to 2 M.

Light having an energy above a band gap of the nitride semiconductor layer may be irradiated on the surface of the nitride semiconductor layer during the porous surface modification of the nitride semiconductor layer.

In addition, if necessary, a current may be applied to the substrate by an external power source during the porous surface modification of the GaN layer. A temperature of the etching solution for the surface modification may be changed.

The semiconductor device may include a light emitting diode having an active layer between an n-type nitride semiconductor layer and a p-type nitride semiconductor layer.

The semiconductor device may include an optical device, such as a light emitting diode, a laser diode, a photo detector, or a solar cell, or may include an electronic device, such as a transistor.

According to the semiconductor device and the manufacturing method thereof set forth above, the GaN layer is re-grown on the porous GaN layer formed on the sapphire crystal plane of the sapphire substrate, which enables the growth of the non-polar/semi-polar nitride semiconductor layer, and the nitride semiconductor optical device is formed on the re-grown GaN layer. Therefore, the GaN layer may have a low crystal defect density, improving the reliability and performance (e.g., brightness) of the semiconductor device.

DETAILED DESCRIPTION OF EXEMPLARY EMBODIMENTS

Exemplary embodiments of the present invention will be described below in detail with reference to the accompanying drawings. These embodiments are provided so that this disclosure will be thorough and complete, and will fully convey the scope of the invention to those skilled in the art. The invention may, however, be embodied in many different forms and should not be construed as being limited to the embodiments set forth herein. Throughout the drawings and description, like reference numerals will be used to refer to like elements.

Figure 1:
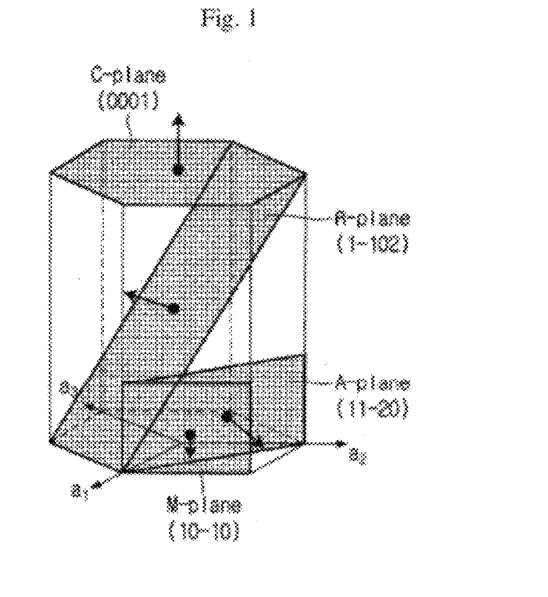
FIG. 1 illustrates a sapphire crystal structure for explaining a crystal plane of a sapphire substrate.

FIG. 1 illustrates a sapphire crystal structure for explaining a crystal plane of a sapphire substrate.

In general, if a nitride semiconductor, such as polar GaN, is grown on a sapphire substrate using a C-plane (e.g., (0001) plane) as a sapphire crystal plane, as illustrated in FIG. 1, the internal quantum efficiency may be reduced by a piezoelectric effect caused by the formation of a polarization field.

In an embodiment of the present invention, a nitride semiconductor optical device structure, such as an LED, an LD, a photo detector, or a solar cell, is formed on a sapphire substrate, and an A-plane (e.g., (11-20) plane), an M-plane (e.g., (10-10) plane), or an R-plane (e.g., (1-102) plane) in FIG. 1 is used as a crystal plane of the sapphire substrate, so that a non-polar or semi-polar nitride semiconductor layer can be grown thereon. If necessary, the C-plane may be used as the crystal plane of the sapphire substrate, and a non-polar or semi-polar nitride semiconductor layer may be formed thereon.

Figure 2:
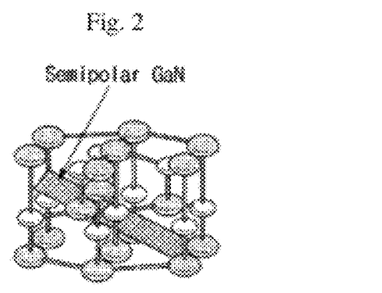
FIG. 2 illustrates a semi-polar GaN crystal structure for explaining a semi-polar nitride semiconductor layer.

For example, in a case where the M-plane is selected as the crystal plane of the sapphire substrate, a semi-polar nitride semiconductor layer grown in a direction perpendicular to a (11-22) plane may be formed on the corresponding crystal plane as illustrated in FIG. 2. In a case where the A-plane is selected as the crystal plane of the sapphire substrate, a semi-polar nitride semiconductor layer grown in a predetermined direction may be formed on an off-axis of the corresponding crystal plane. In a case where the R-plane is selected as the crystal plane of the sapphire substrate, a non-polar nitride semiconductor layer grown in a direction perpendicular to a (11-20) plane may be formed on an off-axis of the corresponding crystal plane. As described above, the C-plane may be selected as the crystal plane of the sapphire substrate, and a predetermined non-polar or semi-polar nitride semiconductor layer may be formed thereon.

Even in the case of using a sapphire substrate which enables the growth of a nitride semiconductor layer such as non-polar or semi-polar GaN, if a template layer including a nitride semiconductor layer is formed on the sapphire substrate, many crystal defects, such as a line defect and a point defect, may be caused by a lattice mismatch and a difference in coefficient of thermal expansion between elements. Such crystal defects have a bad influence on the reliability of an optical device, for example, a resistance to electrostatic discharge (ESD), and are also the cause of current leakage. As a result, the quantum efficiency of the optical device may be reduced, leading to the performance degradation of the optical device. In an embodiment of the present invention, when a template layer is formed on a sapphire substrate which enables the growth of a non-polar or semi-polar nitride semiconductor layer, the above-described problems may be solved by performing a surface modification to form a porous GaN layer and re-growing a nitride semiconductor layer, for example, an $In_xAl_yGa_{1-x-y}N$ layer ($0 \leq x \leq 1$, $0 \leq y \leq 1$, $0 \leq x+y \leq 1$), on the surface-modified GaN layer.

The following description will be given on a method for manufacturing a semiconductor optical device. In order to form a non-polar or semi-polar nitride semiconductor layer, the semiconductor optical device employs a sapphire substrate that uses an A-plane, an M-plane, or an R-plane as a crystal plane, and the semiconductor to optical device is formed on a template layer including a GaN layer having pores formed through a surface modification. The semiconductor optical device refers to a nitride semiconductor optical device, such as an LED, an LD, a photo detector, or a solar cell. Although an LED will be described as an example of the semiconductor optical device, the invention is not limited thereto. The invention may also be similarly applied to a is method for manufacturing other nitride semiconductor optical devices, such as an LD, a photo detector, or a solar cell. Moreover, the method for manufacturing the semiconductor optical device according to the present invention may also be similarly applied to a method for manufacturing a semiconductor electronic device, such as a general diode or transistor.

Figure 3:
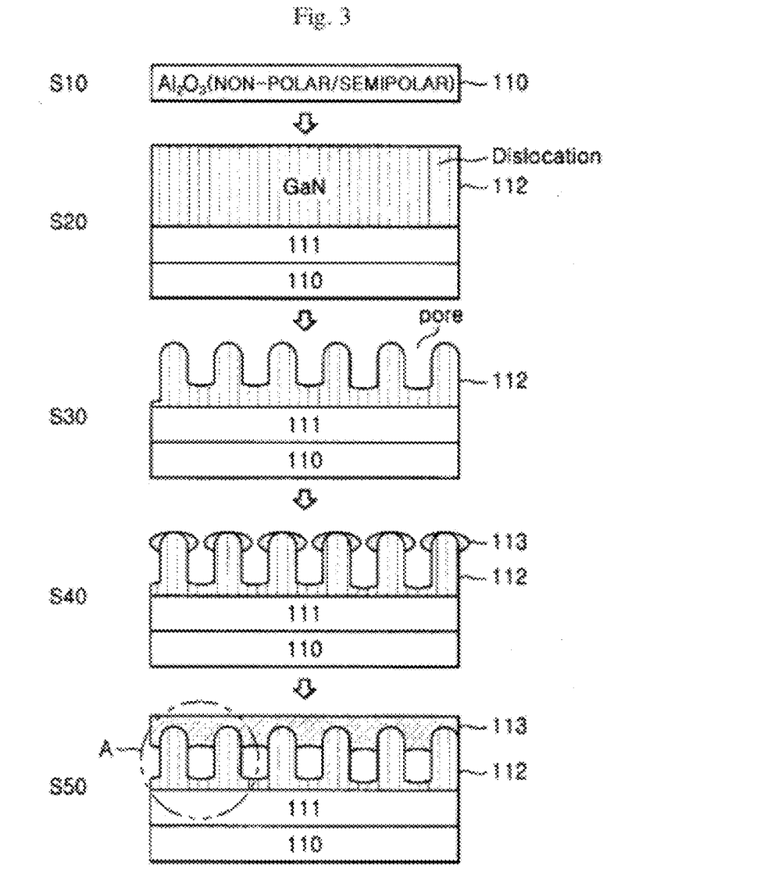
FIG. 3 is a cross-sectional view for explaining a process of forming a porous GaN layer on a sapphire substrate and a process of re-growing a GaN layer according to an embodiment of the present invention.

FIG. 3 is a cross-sectional view for explaining a process of forming a porous GaN layer on a sapphire substrate and a process of re-growing an $In_xAl_yGa_{1-x-y}N$ layer ($0 \le x \le 1$, $0 \le y \le 1$, $0 \le x+y \le 1$) according to an embodiment of the present invention.

First, a sapphire substrate 110, which enables the growth of a non-polar or semi-polar nitride semiconductor layer, is prepared (S10).

Then, a buffer layer 111 and a GaN layer 112, which constitute a template layer, are formed on the sapphire substrate 110 (S20). The buffer layer 111 may be a low-temperature nitride semiconductor layer, which may have an empirical formula of $In_xAl_yGa_{1-x-y}N$ ($0 \le x \le 1$, $0 \le y \le 1$, $0 \le x+y \le 1$) and be formed to a thickness of 10 to 20,000 Å at a certain temperature within a temperature range of 400 to 700° C. The GaN layer 112 may be a high-temperature undoped GaN layer, which may be grown at a high temperature, for example, at a certain temperature within a temperature range of 800 to 1,100° C., and be formed to a thickness of 10 to 20,000 Å. In this case, the GaN layer 112 may be an $In_xAl_yGa_{1-x-y}N$ ($0 \le x \le 1$, $0 \le y \le 1$, $0 \le x+y \le 1$), a p-type doped GaN layer doped with impurities such as Mg, or an n-type doped GaN layer doped with impurities such as Si.

Figure 5:
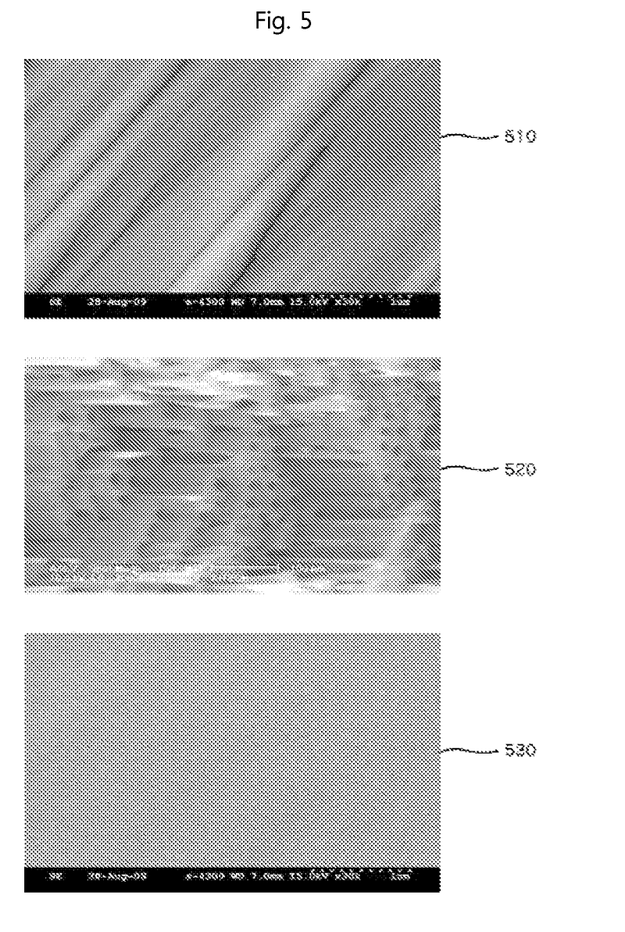
FIG. 5 is a scanning electron microscopy (SEM) photograph of the GaN layer formed through the process of FIG. 3.

The buffer layer 111 and the GaN layer 112 may be formed through a is vacuum deposition process, such as metal organic chemical vapor deposition (MOCVD). As indicated by reference numeral 510 of FIG. 5, showing the SEM photograph of the surface of the GaN layer 112 formed as above, many crystal defects (or dislocation), such as a line defect or an area defect, may be contained in the GaN layer 112.

Then, the GaN layer 112 is surface-modified to form pores thereon (S30). The sapphire substrate 110, on which the GaN layer 112 is formed, is dipped into a wet etching solution, such as an acid solution (e.g., $H_2SO_4$ solution) or an alkali solution (e.g., KOH or NaOH) for several to tens of minutes, depending on a concentration of the wet etching solution, such that irregular pores are formed on the surface of the GaN layer 112. In this manner, the GaN layer 112 may be surface-modified to form pores thereon. For example, as the wet etching solution for the surface modification to form the porous GaN layer 112, a solution containing potassium hydroxide, sodium hydroxide, sulfuric acid, phosphoric acid, nitric acid, or hydrochloric acid in a concentration range of 0.001 M to 2 M may be used. In addition, ultraviolet light or a laser beam may be irradiated on the surface of the GaN layer 112, so that pores can be rapidly formed on the surface of the GaN layer 112 to thereby achieve the porous surface modification. In this case, the ultraviolet light or the laser beam having an energy above a band gap of GaN may activate the GaN layer 112 to help facilitating the porous surface modification. If necessary, an external current may be applied to the substrate on which the GaN layer 112 is formed. In some cases, a temperature of the etching solution may also be changed. As indicated by reference numeral 520 of FIG. 5, showing the SEM photograph of the surface of the surface-modified GaN layer 112, it is can be seen that a large number of pores were formed on the surface of the surface-modified GaN layer 112.

Meanwhile, although the wet etching process for the surface modification to form the porous GaN layer 112 has been described as an example, the invention is not limited thereto. In some cases, the GaN layer 112 may be surface-modified to form pores thereon by a dry etching process such as a reactive ion etching (RIE) process.

After the surface modification is performed to form the GaN layer 112 having irregular pores, an $In_xAl_yGa_{1-x-y}N$ layer ($0 \le x \le 1$, $0 \le y \le 1$, $0 \le x+y \le 1$) is re-grown through a vacuum deposition process such as metal organic chemical vapor deposition (MOCVD). The re-grown $In_xAl_yGa_{1-x-y}N$ layer may be an undoped GaN layer. In some cases, the re-grown $In_xAl_yGa_{1-x-y}N$ layer may be a p-type doped layer doped with impurities such as Mg, or an n-type doped layer doped with impurities such as Si.

Figure 4:
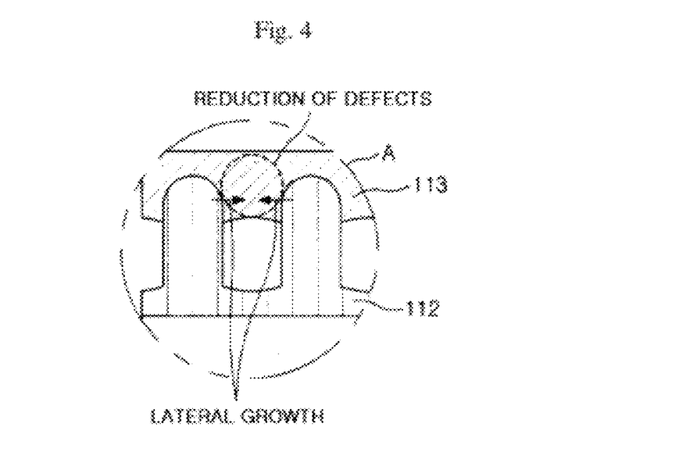
FIG. 4 is a view for explaining a lateral growth by the porous GaN layer is according to an embodiment of the present invention.

In the re-growth process of the GaN layer, the $In_xAl_yGa_{1-x-y}N$ layer ($0 \le x \le 1$, $0 \le y \le 1$, $0 \le x+y \le 1$) is grown on the GaN layer 112 before re-growth, and the $In_xAl_yGa_{1-x-y}N$ layer ($0 \le x \le 1$, $0 \le y \le 1$, $0 \le x+y \le 1$) is re-grown laterally within the pores as illustrated in FIG. 4. Accordingly, the defects may be reduced. The re-grown $In_xAl_yGa_{1-x-y}N$ layer 113 may be a high-temperature undoped layer, which may be grown at a high temperature, for example, at a certain temperature within a temperature range of 800 to 1,100° C., and may be formed to cover the entire pores at a predetermined thickness (S50). The re-grown $In_xAl_yGa_{1-x-y}N$ layer 113 may be formed to a thickness of 10 to 20,000 Å. As indicated by reference numeral 530 of FIG. 5, is showing the SEM photograph of the surface of the re-grown $In_xAl_yGa_{1-x-y}N$ layer 113, it can be seen that many crystal defects (or dislocation), such as a line defect or an area defect, were reduced as compared to the GaN layer 112 before re-grown (see 510 of FIG. 5), and thus, the crystal growth were achieved in a uniform and fine structure.

Figure 6:
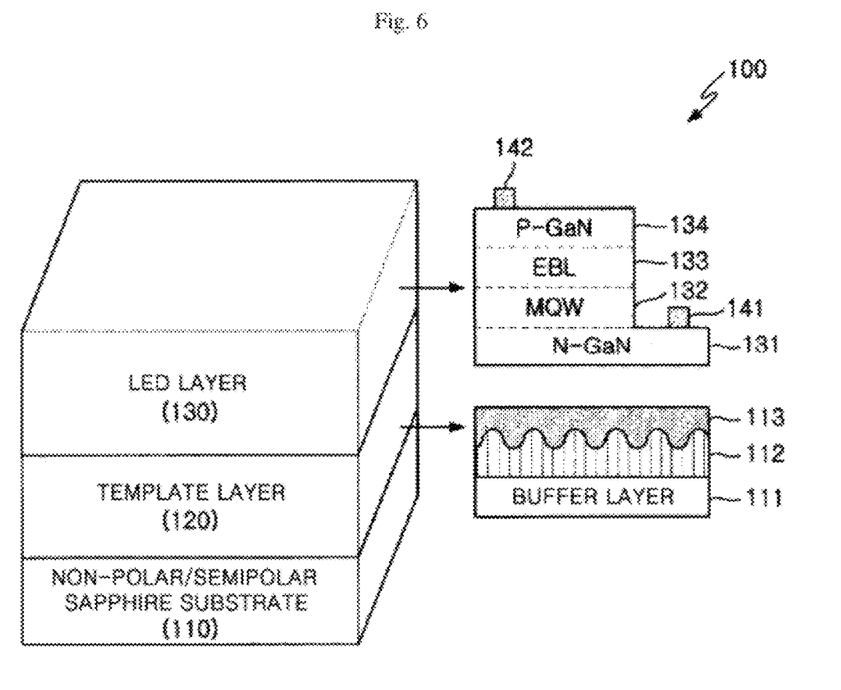
FIG. 6 is a cross-sectional view for explaining a structure of a semiconductor optical device according to an embodiment of the present invention.

FIG. 6 is a cross-sectional view for explaining a structure of a semiconductor optical device 100 according to an embodiment of the present invention.

Referring to FIG. 6, the semiconductor optical device 100 according to the embodiment of the present invention includes a sapphire substrate 110, a template layer 120, and an LED layer 130. The template layer 120 and the LED layer 130 are formed on the sapphire substrate 110.

The sapphire substrate 110 has an A-plane, an M-plane, or an R-plane, on which a non-polar or semi-polar nitride semiconductor layer can be grown.

As described above with reference to FIG. 3, the template layer 120 includes the buffer layer 111 and the GaN layer 112. In addition, the template layer 120 further includes the $In_xAl_yGa_{1-x-y}N$ layer 113 formed by re-growing the GaN layer after performing the surface modification such that the GaN layer 112 has the pores. The buffer layer 111 may be a low-temperature nitride semiconductor layer, which may have an empirical formula of $In_xAl_yGa_{1-x-y}N$ ($0 \le x \le 1$, $0 \le y \le 1$, $0 \le x+y \le 1$) and be formed to a thickness of 10 to 20,000 Å at a certain temperature within a temperature range of 400 to 700° C. Each of the GaN layer 112 before re-growth and the re-grown $In_xAl_yGa_{1-x-y}N$ layer 113 may be formed to a thickness of 10 to 20,000 Å at a certain temperature within a temperature range of 800 to 1,100° C., and may be an undoped layer.

Accordingly, as indicated by reference numeral 510 of FIG. 5, a lot of crystal defects exist in the GaN layer 112 before re-growth. On the contrary, as indicated by reference numeral 530 of FIG. 5, when the template layer 120 including the $In_xAl_yGa_{1-x-y}N$ layer 113 re-grown after the surface modification is formed according to the embodiment of the present invention, crystal defects are considerably reduced. The reduction in the crystal defects results from the lateral crystal growth within the pores. The uniform non-polar or semi-polar nitride semiconductor layer with reduced crystal defects can be verified from XRD measurement results of FIGS. 7 and 8.

Figure 7:
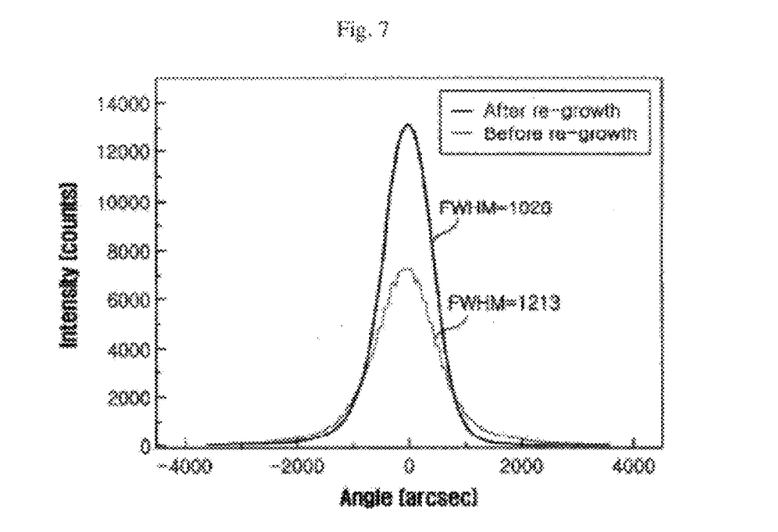
FIG. 7 is a view for explaining X-ray diffraction (XRD) measurement results before and after the re-growth of the GaN layer in a direction parallel to an M-direction according to an embodiment of the present invention.

FIG. 7 is a view for explaining XRD measurement results before and after the re-growth of the GaN layer in a direction parallel to an M-direction according to an embodiment of the present invention. As can be seen from the XRD intensity of FIG. 7, in the case of the GaN layer 112 before re-growth, a full-width at half maximum (FWHM) value was about 1,213 arcsec in a direction parallel to the M-direction. In the case (after re-growth) of the $In_xAl_yGa_{1-x-y}N$ layer 113 re-grown after the porous surface modification, an FWHM value was reduced to about 1,026 arcsec in a direction parallel to the M-direction. This result was obtained when an R-plane was used as a sapphire crystal plane and a non-polar GaN layer was formed in a direction perpendicular to an A-plane.

Figure 8:
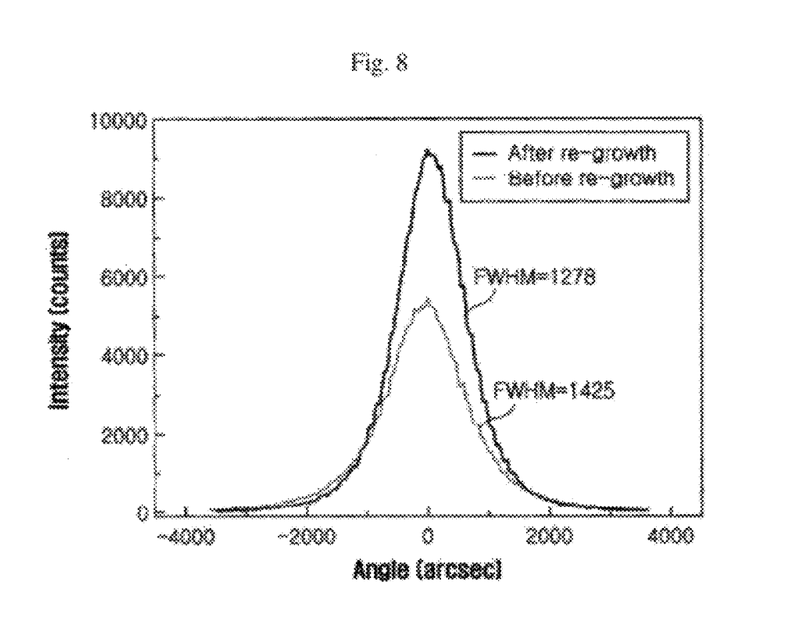
FIG. 8 is a view for explaining X-ray diffraction (XRD) measurement results before and after the re-growth of the GaN layer in a direction perpendicular to an M-direction according to an embodiment of the present invention.

FIG. 8 is a view for explaining XRD measurement results before and after the re-growth of the GaN layer in a direction perpendicular to an M-direction according to an embodiment of the present invention. As can be seen from the XRD intensity of FIG. 8, in the case of the GaN layer 112 before re-growth, an FWHM value was about 1,425 arcsec in a direction perpendicular to the M-direction. In the case is (after re-growth) of the $In_xAl_yGa_{1-x-y}N$ layer 113 re-grown after the porous surface modification, an FWHM value was reduced to about 1,278 arcsec in a direction perpendicular to the M-direction. This result was also obtained when an R-plane was used as a sapphire crystal plane and a non-polar GaN layer was formed in a direction perpendicular to an A-plane.

As described above, the FWHM value obtained in the structure having the $In_xAl_yGa_{1-x-y}N$ layer 113 re-grown after the porous surface modification according to the embodiment of the present invention was much smaller than that obtained in the structure having only the GaN layer 112 before re-growth. This represents that the degree of crystallinity is high in the structure in which the GaN layer is re-grown after the porous surface modification.

In a case where the template layer 120, in which the crystal defects are remarkably reduced and the degree of crystallinity is improved, is formed and then the semiconductor optical device structure, such as an LED, an LD, a photo detector, or a solar cell, is formed on the template layer 120, it may be possible to suppress a current leakage occurring in a polar nitride semiconductor layer, like in the structure of the related art. Moreover, an electron-hole recombination rate in the optical device may be increased, improving the quantum efficiency thereof. As a result, the brightness of the to optical device may be improved.

For example, in a case where the LED layer 130 is formed on the template layer 120, the LED layer 130 may have a structure in which active layers 132 and 133 are disposed between an n-type nitride semiconductor layer 131 and a p-type nitride semiconductor layer 134, as illustrated in FIG. 6.

The n-type nitride semiconductor layer 131 may be formed by growing a GaN layer doped with impurities, such as Si, to a thickness of about 2 micrometers.

The active layers 132 and 133 may include a multi quantum well (MQW) layer 132 and an electron blocking layer (EBL) 133. Specifically, the MQW layer 132 may be formed by alternately laminating a GaN barrier layer (about 7.5 nanometers) and an $In_{0.15}Ga_{0.85}N$ quantum well layer (about 2.5 nanometers) several times (for example, five times). The electron blocking layer 133 may be formed using an $Al_{0.12}Ga_{0.88}N$ layer (about 20 nanometers).

The InGaN quantum well layer and the GaN barrier layer of the MQW layer 132 may be doped at a Si dopant concentration of about $1×10^{19}/cm^3$, and the electron blocking layer 133 may be doped at a Mg dopant concentration of about $5×10^{19}/cm^3$. Although the $In_{0.15}Ga_{0.85}N$ layer has been described as an example of the InGaN quantum well layer, the invention is not limited thereto. Like $In_xGa_{1-x}N$ (0<x<1), a ratio of In and Ga may be changed. In addition, although the $Al_{0.12}Ga_{0.88}N$ layer has been described as an example of the electron blocking layer 133, the invention is not limited thereto. Like $Al_xGa_{1-x}N$ (0<x<1), a ratio of Al and Ga may be changed. Furthermore, the InGaN quantum well layer and the GaN barrier layer of the MQW layer 132 may be doped with at least one of O, S, C, Ge, Zn, Cd, and Mg, as well as Si.

The p-type nitride semiconductor layer 134 may be formed by growing a GaN layer doped at an Mg dopant concentration of about $5×10^{19}/cm^3$ to a thickness of about 100 nanometers.

Electrodes 141 and 142 for applying voltages may be formed on the n-type nitride semiconductor layer 131 and the p-type nitride semiconductor layer 134, respectively. The completed LED may be mounted on a predetermined package substrate and function as an individual optical device.

Figure 9:
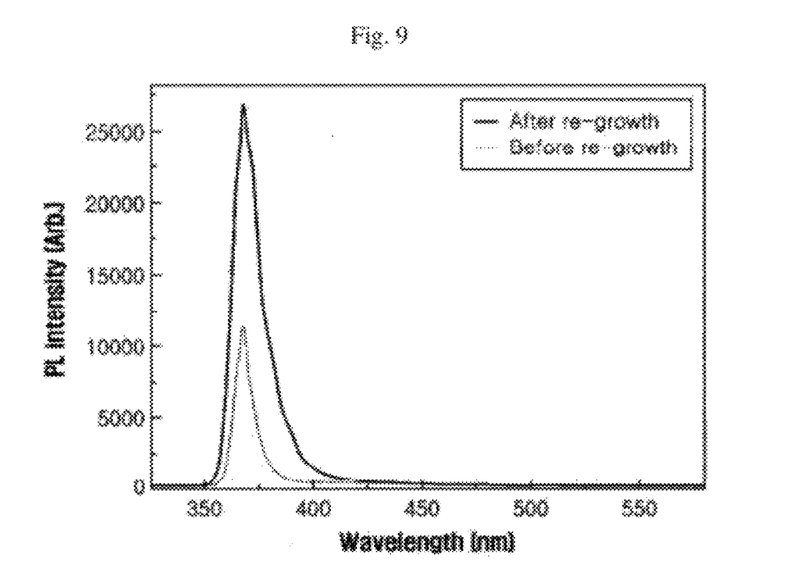
FIG. 9 is a graph for comparing photoluminescence (PL) intensities of the semiconductor optical device before and after the re-growth of the GaN layer.

FIG. 9 is a graph for comparing PL intensities of the semiconductor optical device before and after the re-growth of the GaN layer.

Referring to FIG. 9, in a structure in which an R-plane is used as a sapphire crystal plane; a non-polar GaN layer is formed in a direction perpendicular to an A-plane; and an LED is formed on the non-polar GaN layer, the PL intensity in the case of the GaN layer 112 before re-growth was low. On the contrary, in a case (after re-growth) in which the $In_xAl_yGa_{1-x-y}N$ layer 113 was re-grown after the porous surface modification according to the embodiment of the present invention, the PL intensity in a corresponding visible light wavelength was more than about 2.5 times higher.

As described above, not only the LED layer 130 but also other semiconductor optical device structures, such as an LD, a photo detector, and a solar cell, or other semiconductor electronic devices, such as general diode or transistor, may be formed on the template layer 120, as illustrated in FIG. 6. A piezoelectric effect may be suppressed at the active layers 132 and 133, and so on. Therefore, the electron-hole recombination rate and the quantum efficiency may be improved, contributing to the performance (e.g., brightness) improvement of the devices.

Although the sapphire substrate has been described above as an example, a variety of substrates, which enable the growth of nitride semiconductor, may be used herein. For example, in addition to the sapphire substrate, a SiC substrate or a Si substrate may also be used herein.

While the embodiments of the present invention has been described with is reference to the specific embodiments, it will be apparent to those skilled in the art that various changes and modifications may be made without departing from the spirit and scope of the invention as defined in the following claims.

The invention claimed is:

1. A method for manufacturing a semiconductor device, the method comprising:
   forming a first nitride semiconductor layer on a substrate;
   forming irregular pores in a surface of the first nitride semiconductor layer by etching the first nitride semiconductor layer using a process selected from the group consisting of reactive ion etching and dipping in a wet etching solution;
   forming a second nitride semiconductor layer on the first nitride semiconductor layer so as to cover the pores, wherein lateral crystal growth of the second nitride semiconductor layer completely fills the pores; and
   forming a semiconductor device structure on the second nitride semiconductor layer, wherein upper side surfaces of the pores in the first nitride semiconductor layer form a lateral crystal growth region for growth of the second nitride semiconductor layer, and wherein a portion of the second nitride semiconductor layer disposed in the pores is grown from the upper side surfaces of the pores.

2. The method of claim 1, wherein the first nitride semiconductor layer comprises an $In_xAl_yGa_{1-x-y}N$ ($0 \le x \le 1$, $0 \le y \le 1$, $0 \le x+y \le 1$) layer, an undoped GaN layer, an n-type doped GaN layer, or a p-type doped GaN layer.

3. The method of claim 1, wherein the substrate comprises a sapphire substrate, a SiC substrate, or a Si substrate.

4. The method of claim 1, wherein the crystal plane of the substrate comprises an A-plane, an M-plane, or an R-plane.

5. The method of claim 1 wherein:
the pores are formed in the first nitride semiconductor layer using the wet etching solution; and
the growth of the first nitride semiconductor layer, and the growth of the second nitride semiconductor layer are performed by a metal organic chemical vapor deposition (MOCVD) process.

6. The method of claim 5, wherein the wet etching solution comprises a solution containing potassium hydroxide, sodium hydroxide, sulfuric acid, phosphoric acid, nitric acid, or hydrochloric acid in a concentration range of 0.001 M to 2 M.

7. The method of claim 1, wherein the pores are formed in the first nitride semiconductor layer by using the reactive ion etching process.

8. The method of claim 1, wherein light having an energy above a band gap of the first nitride semiconductor layer is irradiated on the surface of the first nitride semiconductor layer during formation of the pores in the first nitride semiconductor layer.

9. The method of claim 1, wherein the semiconductor device comprises a light emitting diode comprising an active layer between an n-type nitride semiconductor layer and a p-type nitride semiconductor layer.

10. The method of claim 1, wherein the semiconductor device comprises an optical device comprising a light emitting diode, a laser diode, a photo detector, or a solar cell, or comprises an electronic device comprising a transistor.

11. A method for manufacturing a semiconductor device, the method comprising:
forming a first nitride semiconductor layer on a substrate;
forming irregular pores in a surface of the first nitride semiconductor layer by etching the first nitride semiconductor layer using a process selected from the group consisting of reactive ion etching and dipping in a wet etching solution;
forming a second nitride semiconductor layer on the first nitride semiconductor layer so as to cover the pores, wherein lateral crystal growth of the second nitride semiconductor layer completely fills the pores; and
forming a semiconductor device structure on the second nitride semiconductor layer,
wherein forming the second nitride semiconductor layer comprises growing the second nitride semiconductor layer laterally outward from top surfaces of the first nitride semiconductor layer respectively disposed between the pores, and
wherein a portion of the second nitride semiconductor layer disposed in the pores is grown from the upper side surfaces of the pores.

\* \* \* \* \*